United States Patent
Yu

(10) Patent No.: US 7,880,166 B2
(45) Date of Patent: Feb. 1, 2011

(54) FAST RECOVERY REDUCED P-N JUNCTION RECTIFIER

(75) Inventor: Ho-Yuan Yu, 19308 Vendura Ct., Saratoga, CA (US) 95070

(73) Assignee: Ho-Yuan Yu, Saratoga, CA (US)

( * ) Notice: Subject to any disclaimer, the term of this patent is extended or adjusted under 35 U.S.C. 154(b) by 430 days.

(21) Appl. No.: 11/801,023

(22) Filed: May 8, 2007

(65) Prior Publication Data
US 2007/0262304 A1    Nov. 15, 2007

Related U.S. Application Data

(60) Provisional application No. 60/799,252, filed on May 10, 2006.

(51) Int. Cl.
*H01L 29/10* (2006.01)
(52) U.S. Cl. .................. 257/44; 257/E29.327
(58) Field of Classification Search ............ 257/44, 257/328, 480, E29.327, E29.338
See application file for complete search history.

(56) References Cited

U.S. PATENT DOCUMENTS

| | | | |
|---|---|---|---|
| 4,259,680 A | 3/1981 | Lepselter et al. | |
| 4,483,726 A | 11/1984 | Isaac et al. | |
| 4,581,319 A | 4/1986 | Wieder et al. | |
| 4,729,965 A | 3/1988 | Tamaki et al. | |
| 5,024,957 A | 6/1991 | Harame et al. | |
| 5,098,854 A | 3/1992 | Kapoor et al. | |
| 5,101,256 A | 3/1992 | Harame et al. | |
| 5,162,876 A * | 11/1992 | Kitagawa et al. | 257/138 |
| 6,261,874 B1 | 7/2001 | Francis et al. | |
| 6,261,875 B1 | 7/2001 | Zhang et al. | |
| 6,486,524 B1 | 11/2002 | Ahmed | |
| 6,498,367 B1 * | 12/2002 | Chang et al. | 257/341 |
| 6,603,153 B2 | 8/2003 | Francis et al. | |
| 6,686,614 B2 | 2/2004 | Tihanyi | |
| 6,699,755 B1 | 3/2004 | Chiou et al. | |
| 6,870,199 B1 | 3/2005 | Yoshikawa et al. | |

(Continued)

FOREIGN PATENT DOCUMENTS

JP    2000-49361    2/2000

(Continued)

OTHER PUBLICATIONS

U.S. Notice of Allowance for U.S. Appl. No. 11/804,229, mailed on Jun. 16, 2010 (9 pages).

*Primary Examiner*—Sue A Purvis
*Assistant Examiner*—Selim Ahmed
(74) *Attorney, Agent, or Firm*—Cheng Intellectual Property Group

(57) ABSTRACT

A fast recovery rectifier structure with the combination of Schottky structure to relieve the minority carriers during the forward bias condition for the further reduction of the reverse recovery time during switching in addition to the lifetime killer such as Pt, Au, and/or irradiation. This fast recovery rectifier uses unpolished substrates and thick impurity diffusion for low cost production. A reduced p-n junction structure with a heavily doped film is provided to terminate and shorten the p-n junction space charge region. This reduced p-n junction with less total charge in the p-n junction to further improve the reverse recovery time. This reduced p-n junction can be used alone, with the traditional lifetime killer method, with the Schottky structure and/or with the epitaxial substrate.

16 Claims, 8 Drawing Sheets

U.S. PATENT DOCUMENTS

| | | |
|---|---|---|
| 6,927,141 B2 | 8/2005 | Andoh et al. |
| 2003/0052383 A1* | 3/2003 | Nemoto et al. .............. 257/471 |
| 2005/0139947 A1* | 6/2005 | Okada et al. ................ 257/480 |
| 2006/0211227 A1* | 9/2006 | Chen et al. .................. 438/570 |
| 2006/0255423 A1* | 11/2006 | Ryu et al. .................... 257/485 |

FOREIGN PATENT DOCUMENTS

| | | |
|---|---|---|
| TW | 460983 | 10/2001 |
| TW | 492198 | 6/2002 |
| TW | 503567 | 9/2002 |

* cited by examiner

FAST RECOVERY REDUCED P-N JUNCTION RECTIFIER

CROSS REFERENCE TO RELATED APPLICATIONS

This application claims priority from U.S. Provisional Patent Application No. 60/799,252 filed May 10, 2006 and entitled "Fast Recovery Rectifiers". The provisional application is herein incorporated by reference.

BACKGROUND OF THE INVENTION

1. Field of the Invention

This invention relates generally to the structures of the fast recovery rectifiers. This invention disclosed the method of reducing the reverse recovery time from the conventional fast recovery rectifiers by either introducing the Schottky structure at the front and/or the back of the substrate or introducing the junction termination layer to reduce the total space charge of the p-n junction. Furthermore, this invention also provides the low cost manufacturing of the very fast recovery rectifiers.

2. Description of Related Art

FIG. 1 shows the cross section of the conventional fast recovery rectifier. The doped substrate 100 is made by either n type or p type material. The doped substrate 100 used is a wafer with sawed or unpolished rough surface treatment for cost savings. The polish of the wafer surface is not required in this case. Doping of wafer can be done by either film method or by standard deep diffusion method. The p-n junction 103 can be formed on the doped substrate 100, and the depth of the p-n junction 103 is usually from less than 10 microns to over 20 microns so that the depth of the p-n junction 103 is deeper than the surface damaged region of the rough surface. Then the lifetime killer such as Pt, Au, etc. is added to the wafer with thermal treatment. The reverse recovery time is depending on doping concentration, the thermal treatment temperature, and time of the lifetime killer species. The other method for the lifetime reduction can also be done by irradiation of electrons or other species. After the irradiation treatment, the substrate is being processed by annealing.

The diffusion to the doped substrate 100 is generally using opposite polarity species at the p-n junction 103. The depth of this p-n junction 103 must be deeper than the surface damage region for the reduction of the leakage current. The diffusion to the doped substrate 100 is generally using the same polarity as at the backside layer 101. The passivation layer 104 can be formed after the formation of the p-n junction 103 as well as the life time killer process. The irradiation of the electrons and or other species can be done after the process of the wafer or even in the packaged parts. The passivation layer 104 can be done by conventional glass passivation process or multiple CVD process. The top metal layer 105 is deposited, evaporated, sputtered, or plated along with the top of the p-n junction 103. The bottom layer 105B metallization is to be done by similar metallization process or by nickel plating. After the completion of the process, the wafer is diced into chips for assembly.

FIG. 2 shows the cross section of an epitaxial based fast recovery rectifier in prior art. The epitaxial layer 102 has the same polarity and is grown on the heavily doped substrate 100. The doping concentration and the thickness of the epitaxial layer 102 are determined by the breakdown voltage. The epitaxial layer 102 can be made by single or multiple layers. The p-n junction 103 anode diffusion can be done by either ion implantation or diffusion method of the opposite polarity to the epitaxial layer 102. After the formation of the p-n junction 103 anode diffusion, the life time killer such as Pt, Au or other species with proper thermal treatment can be added to the wafer. After the p-n junction diffusion, the deep etched structure is to be done by wet etch prior to the passivation process. The passivation layer 104 is done either by the conventional glass passivation or multiple CVD layers method. The top metal layer 105 is then opened for the metallization. The top metal layer 105 can be done by the contact metallization using either Ti—TiN—Al, TiNiAg or Nickel plating for either wire bond or soldering. The backside layer 101 can be done by the implantation of similar polarity to the silicon doped substrate 100 or omitted if the doped substrate 100 is heavily doped. The bottom layer 105B metallization is done either by Ti—Ni—Ag or Cr—Au or by Ni plating. After the completion of the process, the wafer is then ready for the dicing and assembly.

U.S. Pat. No. 6,261,874, Francis and Ng disclosed the fast recover diode structure with both Beam Radiation defects and He implanted defects to reduce the reverse recovery time. With this structure, the soft recovery time can result. U.S. Pat. No. 6,486,524 Ahmed disclosed the complicated structure using p-n junction as well as the Al or Pd Schottky for the fast reverse recovery time. U.S. Pat. No. 6,603,153, Francis and Ng disclosed the fast recovery rectifier structure that is similar to U.S. Pat. No. 6,261,875. U.S. Pat. No. 6,699,755 Bol disclosed a fast recovery diode structure similar to U.S. Pat. No. 6,486,524. U.S. Pat. No. 6,870,199 Yoshikawa et al disclosed the multiple life time control region for the improvement of di/dt caused breakdown. U.S. Pat. No. 6,927,141 Andoh et al disclosed the termination structure by using equal metal ring.

SUMMARY OF THE INVENTION

It is therefore an objective of the present invention to provide a low cost and the improvement of the process and device structures. By using the common fast recovery rectifier, a termination structure using glass and/or CVD process is the basic structure to begin with. The substrate is an sawed or non-polished substrate instead of polished wafers for the reduction of the cost. Deep diffusion of opposite polarity to the substrate in one side and the same polarity in the other side are performed. The depth of the diffusion is from less than 10 micron to over 20 microns depending on the surface damage region of the unpolished wafer. This invention adds an etched region with either wet etches or wet/dry etches for the provision of the Schottky contact. This etched region can be a round shape, hexagon, stripe or other shapes. The metallization is then provided for the ohmic contact of the heavily doped rough surface and for Schottky contact of the etched smooth region. The purpose of the Schottky contact is to absorb the minority carrier injections at the forward bias, thus the reverse recovery time is reduced. The similar structure at the other side can also be added for the reduction of the minority carriers. Thus the reduction of the reverse recovery time can be further reduced. In order to improve the reverse recovery time, the conventional method is using the epitaxial wafers and then using life time killing method. The heavily doped substrate is used to decrease the forward voltage drop due to series resistance and in the mean time to reduce the lifetime by reducing the thickness of the lightly doped active epitaxial region. The second objective of this invention is to form a reduced p-n junction space charge region for depletion region) by using a thin and highly doped film of the same polarity as the top junction layer which has opposite polarity to the base silicon substrate. This early termination of the junction charge region reduces the total space charge of the p-n junction, thus the smaller reverse recovery time can be achieved. This method can be used in conjunction with the life time killers and/or with the Schottky structures.

DETAILED DESCRIPTION OF THE PREFERRED EMBODIMENT

Embodiment One

Figure 1:
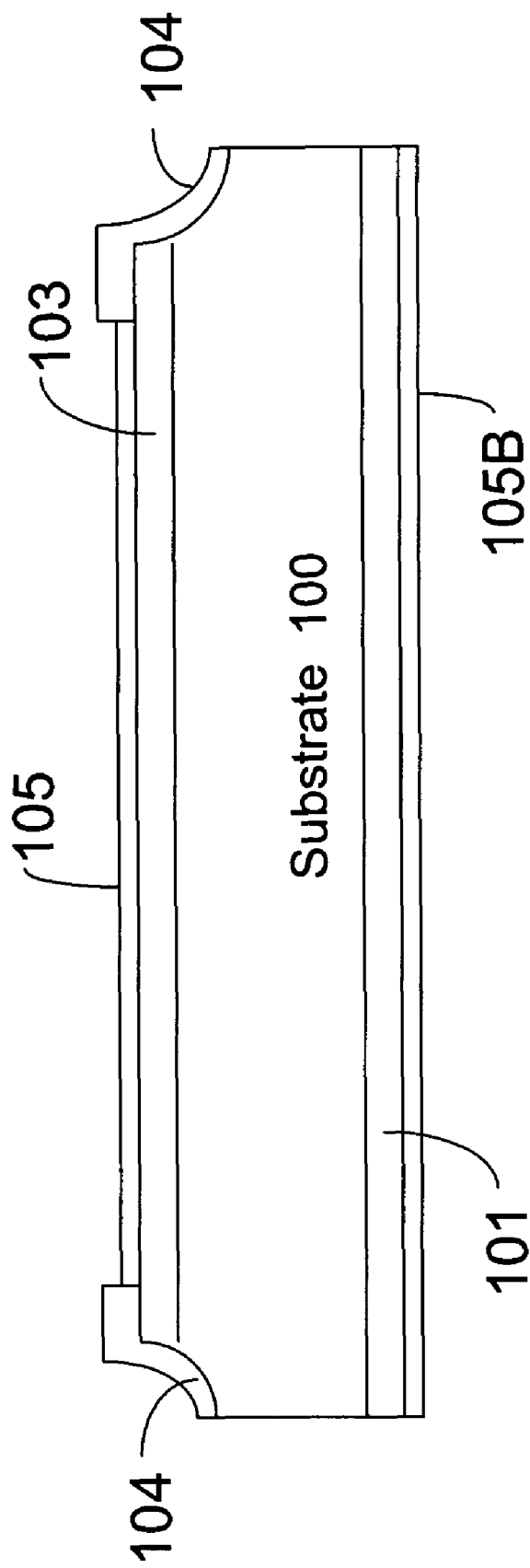
FIG. 1 shows the cross section of the conventional fast recovery rectifier.
Figure 2:
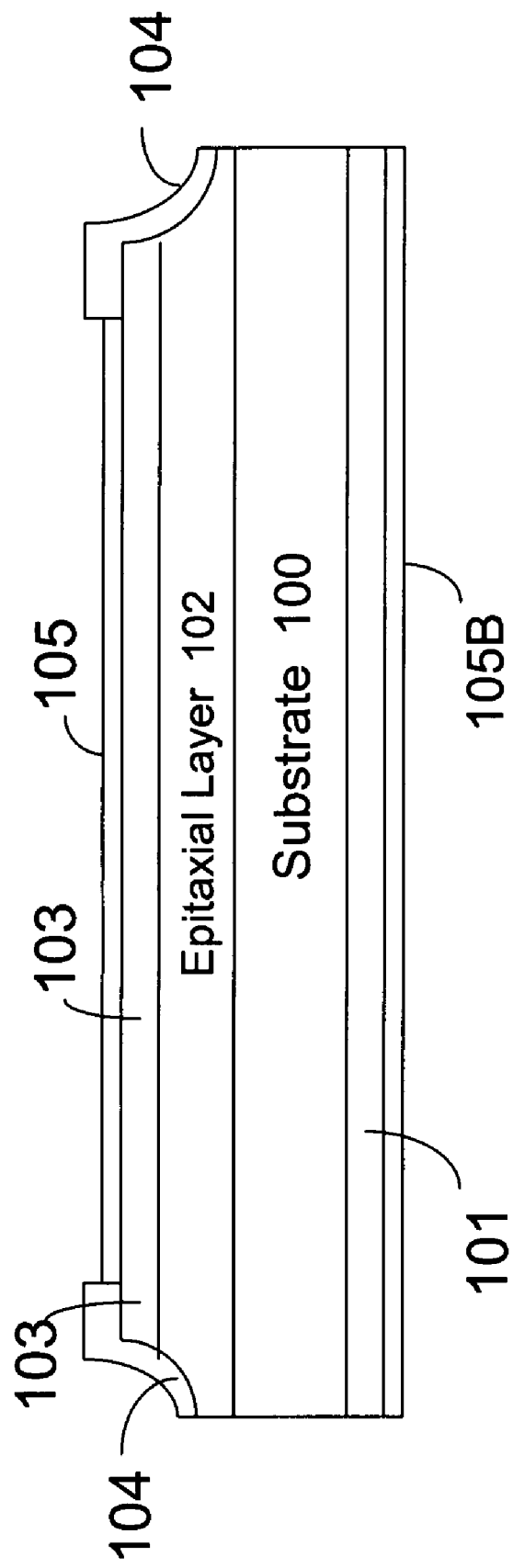
FIG. 2 shows the cross section of epitaxial based fast recovery rectifier in prior art.
Figure 3:
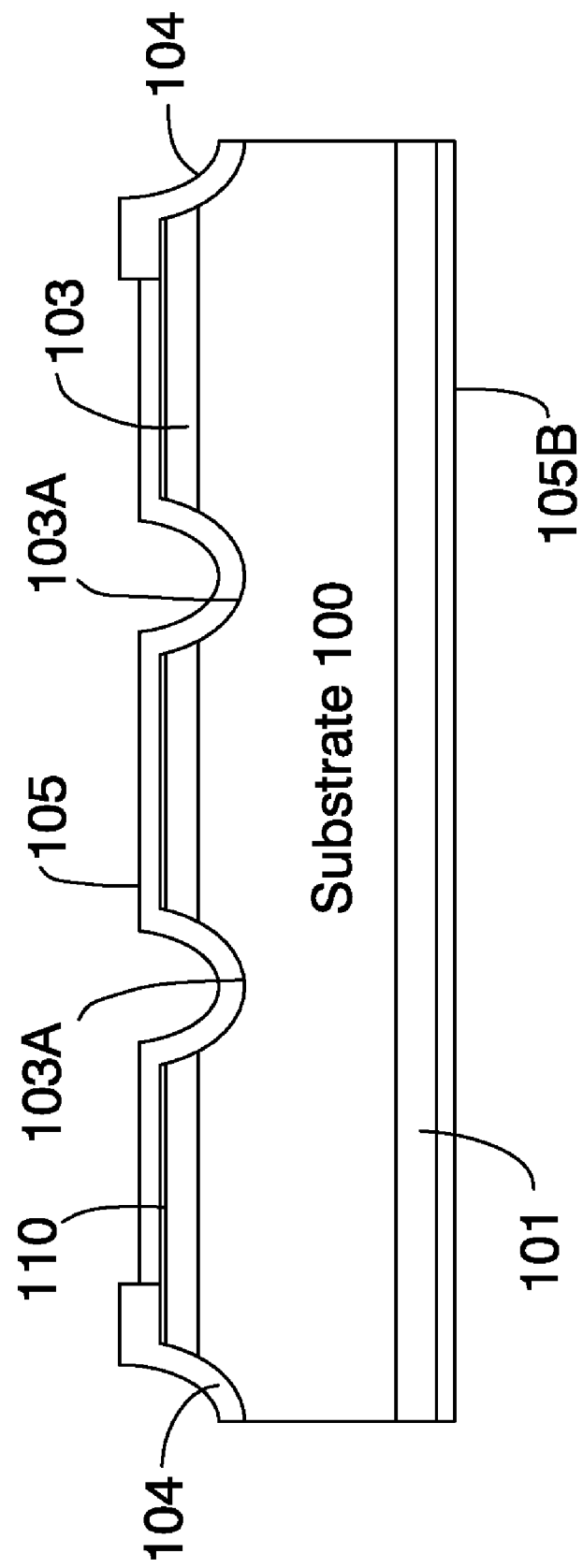
FIG. 3 is a cross-sectional view of the present invention fast recovery rectifier.

FIG. 3 is a cross-sectional view of the present invention fast recovery rectifier that is different from the FIG. 1 in the etched structure 103A. In addition, the etched structure 103A of FIG. 3 can be etched (preferred by wet etch) either in round, hexagon, strip or other shapes. The diameter or the width of the etched structure is generally larger than twice the depth of the p-n junction 103. In general, it is over 20 microns.

The p-n junction 103 is deposited, evaporated, sputtered, or plated along with the top metal layer 105. The p-n junction 103 is terminated early by a very thin and heavily doped layer 110 with the same polarity as 103. This layer 105 can be finished by contact metal and/or barrier metal and/or top metal for soldering or wire bonding. The backside layer 101 is to be done by similar metallization process or by nickel plating. After the completion of the process, the wafer is diced into chips for assembly.

Embodiment Two

Figure 4:
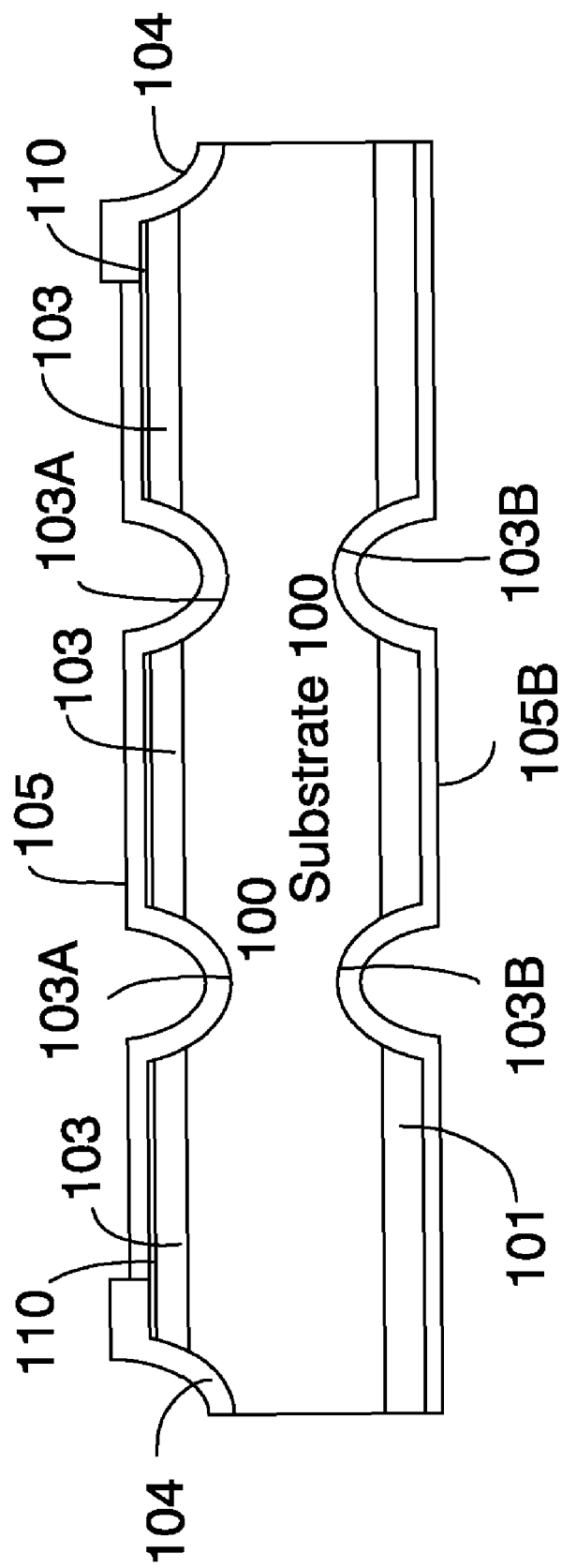
FIG. 4 discloses a cross section similar to FIG. 3 except the back side of the wafer is also etched like the top surface.

FIG. 4 discloses a cross section similar to FIG. 3 except the back side of the wafer is also etched like the top surface. The purpose for this structure is to get the addition of the Schottky surface to absorb the minority carrier at the backside of the chip. The location of the etched structure 103B is not necessary to be aligned with the top surface structure 103A. The shape of the etched structure 103B can be round, hexagon, stripe or other structures depending on the requirement. Both FIG. 3 and FIG. 4 of the present invention offer the low cost versions of the fast recovery rectifiers.

Embodiment Three

Figure 5:
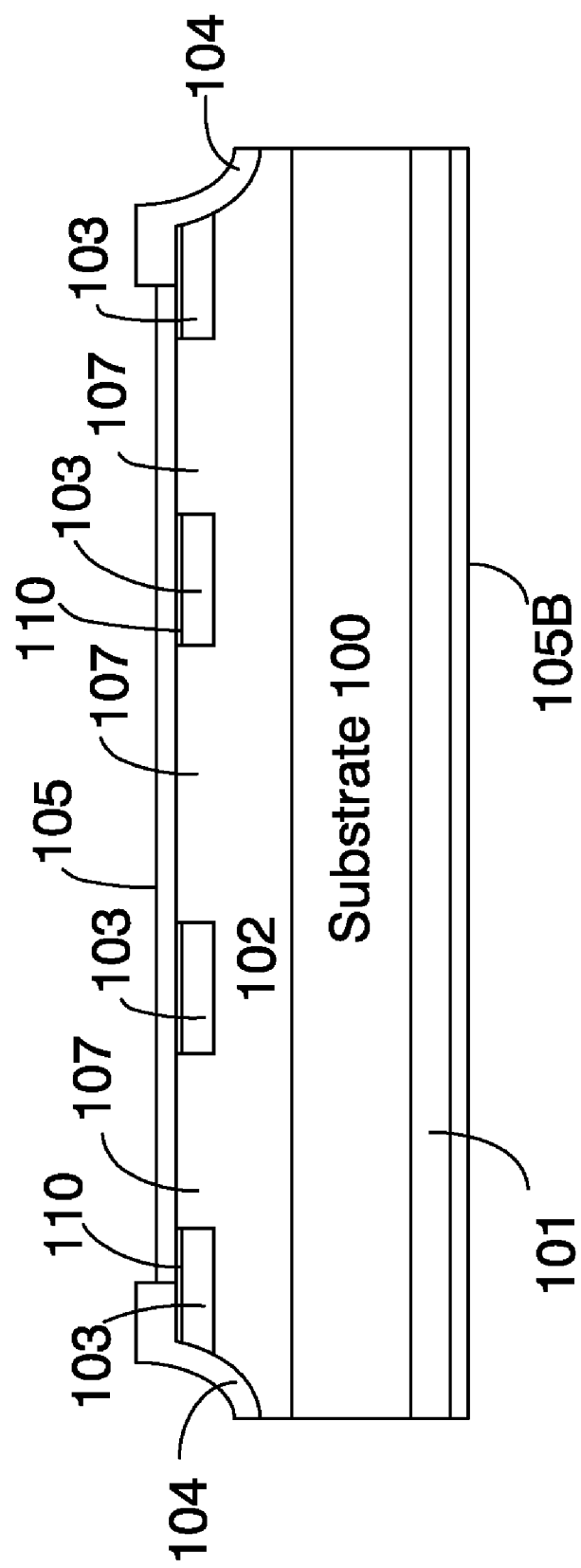
FIG. 5 discloses a cross section of epitaxial based fast recovery rectifier.

FIG. 5 discloses a cross section of epitaxial based fast recovery rectifier. The epitaxial layer 102 has the same polarity and is grown on the heavily doped substrate 100. The doping concentration and the thickness of the epitaxial layer 102 are determined by the breakdown voltage. The epitaxial layer 102 can be made by single or multiple layers. The p-n junction anode diffusion 103 can be done by either ion implantation or diffusion method of the opposite polarity to the epitaxial layer 102 using silicon dioxide as the mask. The p-n junction 103 is terminated early by a very thin and heavily doped layer 110 with the same polarity as 103. For the ion implantation, the photo resist can be used in addition to the oxide layer as the mask. The Schottky contact region 107 is the masked region of photo resist and oxide layer. This masked Schottky contact region 107 is used for the Schottky contact.

In this embodiment, after the formation of the p-n junction anode layer, the life time killer such as Pt, Au or other species with proper thermal treatment can be added to the wafer. On the other hand, after the top layer diffusion, the deep etched structure is to be done by etching, preferably by wet etch prior to the passivation process. The passivation layer 104 is done either by the conventional glass passivation or multiple CVD layers method.

Next, the top metal layer 105 is then opened for the metallization. The top metal layer 105 can be done by the Schottky contact metallization with either Pt, Au, Ni, Mo, W, Cr, Ti etc. followed by the barrier metal layer such as TiW, TiN, and the top metal such as Al, Ag, etc. for either wire bond or soldering. The backside layer 101 can be done by the implantation of similar polarity to the silicon substrate or omitted if the substrate is heavily doped. The bottom layer 105B is done either by Ti—Ni—Ag or Cr—Au or by Ni plating. After the completion of the process, the wafer is then ready for the dicing and assembly.

Figures 6, 7:
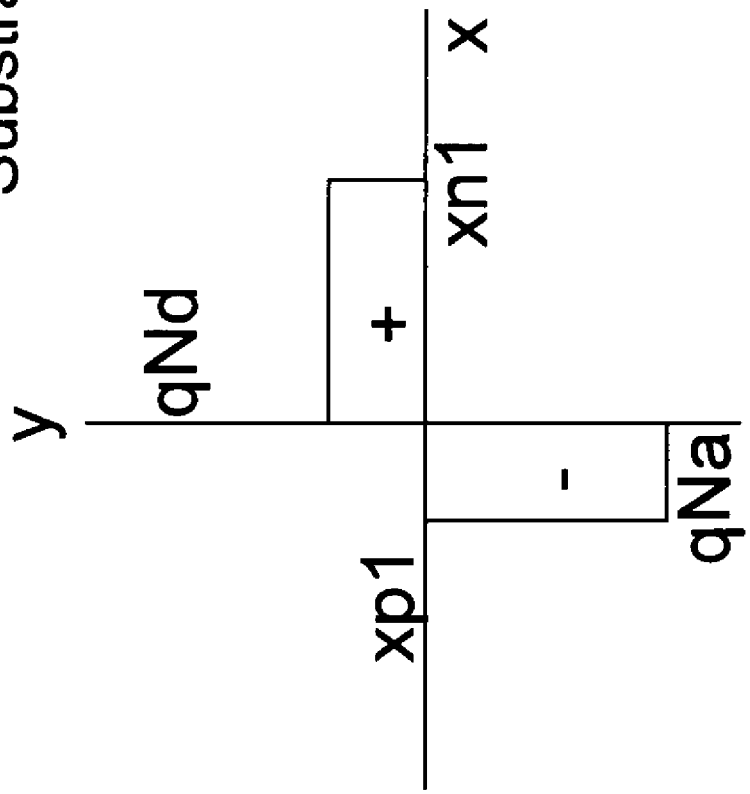
FIG. 6 shows a normal charge diagram of an n-p junction.
FIG. 7 has smaller built-in potential than FIG. 6.

FIG. 6 shows a normal charge diagram of a n-p junction. The total area of qNa×xp1 at p region is equal to that of qNd×xn1 at the n region. Na is the doping concentration of the p region and xp 1 is the charge distance of the p region. By using a heavily doped p layer to make the distance xp2 of p region smaller, the total area of qNa×xp2 is smaller than that of qNa×xp1 with same doping level of Na. In order to balance the total charge, qNd×xn2 is the same as qNa×xp2. Nd is the doping concentration of n region and xn is the charge distance of the n region. Thus the built-in potential of FIG. 7 is smaller than the built-in potential of FIG. 6. In order to get good ohmic contact, this very thin layer of P++ at xp2 must be presented and the same is true for n-p junction. Reduced p-n junction is made by the following conditions: (a) The doping concentration of p region of said reduced p-n junction is in the magnitude from 2 to 10 times the magnitude of the n region, and this can be accomplished by lightly doped implant with low energy and dose—the energy of the implant is from 500 ev to 50 Kev with implant dose from 1.0E12 to 1.0E15 per cm$^2$, and light implant anneal is done by either RTA or furnace in inert ambient. Then, a very shallow p++ region is placed on the top of the p region and the implant dose is from 1.0E12 to 1.0E15 per cm$^2$ with the energy from 100V to 35 Kev, then implant anneal is done by RTA. The heavily doping concentration but very shallow p type region can be used to terminate said p-n junction; (b) Using the heavily doping concentration but very shallow p type region, the heavily doping concentration but very shallow p type region may use low temperature p++ type diffusion with the temperature from 700 deg. C. to 1100 deg C. and time from 60 seconds to one hour with furnace or RTA diffusion. Said reduced p-n junction ranged from 0.5 ev. to 0.9 ev.

Embodiment Four

Figure 8:
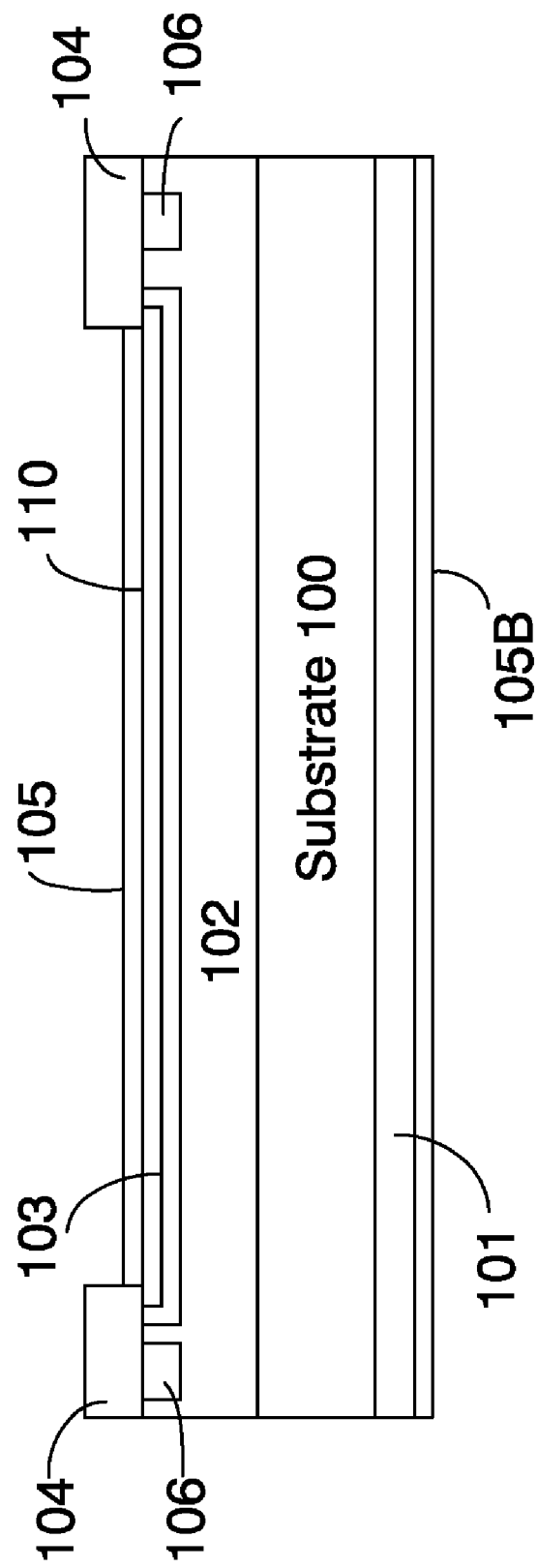
FIG. 8 discloses a cross section of epitaxial based fast recovery rectifier by using guard rings as the termination structure.

FIG. 8 disclosed a cross section of epitaxial based fast recovery rectifier by using guard rings as the termination structure. The insulation layer 104 is a thick oxide from 200 A to over 2 microns. This insulation layer 104 can be formed either by oxidation or CVD layers or both. The guard ring 106 structure is either single guard ring or multiple guarding rings depending on the requirement of the reverse blocking voltage. The guard ring 106 can be formed either by diffusion or implant. The implant dose for the guard ring 106 is from less than 1E10 per $cm^2$ to over 1E15 per $cm^2$ and the implant energy from less than 100V to over 100 Kev depending on the design requirement. The implant dose of the diode regions 103 is done from less than 1E10 per $cm^2$ to over 1E15 per $cm^2$ and the implant energy from less than 100V to over 100 Kev. This implant of diode regions 103 and guard ring 106 is in the opposite polarity to the base material of epitaxial layer 102. The diode termination layer 110 is a very heavy doped region with the same polarity of diode region 103. This diode termination layer 110 can be formed either by the implant energy from 100V to 50 Kev and the dose from 1E11 per $cm^2$ to over 1E15 per $cm^2$ or by diffusion with temperature from 700 deg C. to over 1100 deg C. and the time from over one hour to less than 30 seconds.

In this embodiment, the purpose of diode termination layer 103A is to terminate the p region into the narrower space, thus the total charge will be smaller. The lifetime killer such as Pt, Au, or can be added before or after the process. The top metal layer 105 can be either formed by Au, Pt, W, Mo Cr, Ni, Ti and other metal or used to form the silicide.

Next, the diffusion barrier such as TiW, TiN or other layer is done before the contact layer of the 105 is deposited. The contact layer of the 105 can be either Al for wire bonding or Ag or Au for soldering. The backside layer 101 is implanted or diffused with the similar polarity to the doped substrate 100. If the resistivity of the doped substrate 100 is lower enough, this layer 101 can be eliminated. The bottom layer 105B can be made by the similar metallization process used for the top metal layer 105 or by using convention method such as Cr—Au, Ti—Ni—Ag or even with Nickel plating.

Embodiment Five

Figure 9:
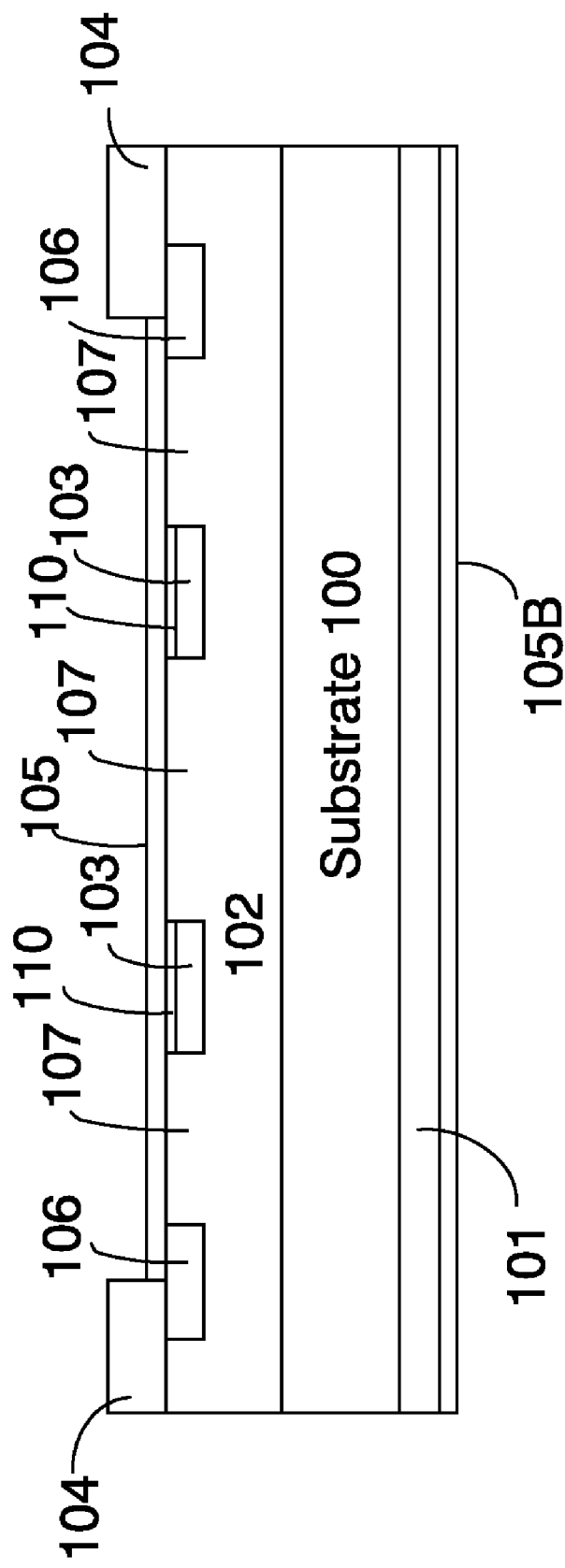
FIG. 9 disclosed a cross section of epitaxial based fast recovery rectifier by using guard rings as the termination structure.

FIG. 9 discloses a cross Section of epitaxial based fast recovery rectifier by using guard rings as the termination structure. The insulation layer 104 is a thick oxide from 200 A to over 2 microns. The guard ring 106 structure is either single guard ring or multiple guarding rings depending on the requirement of the reverse blocking voltage. The guard ring 106 can be formed either by diffusion or implant. The implant dose for the guard ring 106 is from less than 1E10 per $cm^2$ to over 1E15 per $cm^2$ and the implant energy from less than 100V to over 100 Kev depending on the design requirement. The implant species is in the opposite polarity to the epitaxial layer 102. The Schottky contact region 107 can be either in round, hexagon, stripe or other shapes. The Schottky contact region 107 is formed by blocking implant during the formation of region 103, using either oxide and/or photoresist as the blocking layer. Region 103 is terminated early by a thin layer 110 which is heavily doped with same polarity as region 103. The size of 107 is designed by the needs of reverse recovery time. The top metal layer 105 can be either formed by Au, Pt, W, Mo Cr, Ni, Ti and other metal or used to form the silicide, and then followed by the diffusion barrier such as TiW, TiN or other layer before the contact layer is deposited. The contact layer can be either Al for wire bonding or Ag or Au for soldering. The backside layer 101 is a heavily doped region with the same polarity as the doped substrate 100 and the epitaxial layer 102. This layer can be done either by implantation or diffusion. If the resistivity of the substrate 100 is lower enough, this backside layer 101 can be eliminated. The bottom layer 105B uses the similar metallization process as the top metal layer 105 or uses convention method such as Cr—Au, Ti—Ni—Ag or even with Nickel plating. The lifetime killer such as Pt, Au or radiations can be added before or after the process.

The fast recovery rectifier of this invention is accomplished by one or more of following conditions;

Schottky structure is used with the standard fast recovery rectifier by using Pt, Au and/or radiation lifetime killer.

Reduced p-n junction is used with the standard fast recovery rectifier with Pt, Au, and/or radiation lifetime killer.

Reduced p-n junction is used with Schottky structure and standard fast recovery rectifier with Pt, Au and/or radiation lifetime killer.

Reduced p-n junction alone.

Reduced p-n junction is used with Schottky structure.

Reduced p-n junction is used with Schottky structure and standard fast recovery rectifier with Pt, Au and/or radiation lifetime killer with epitaxial substrates.

The fast recovery rectifier of this invention uses the Pt, Au and/or radiation lifetime killer, and combine with Schottky structure to reduce the minority carriers at the forward bias and in the rectifying process condition. The fast recovery rectifier use unpolished rough surface doped substrate and rough diffusion to provide a low cost. This invention is to form a reduced p-n junction space charge region by using a thin and very high doped film of the same polarity as the top junction layer which is opposite polarity to the base silicon substrate. This early termination of the junction charge region reduces the total space charge of the p-n junction, thus the smaller reverse recovery time can be achieved. This method can be used in conjunction with the life time killers and/or with the Schottky structures.

Although the present invention has been described in relation to particular embodiments thereof, many other variations and modifications and other uses will become apparent to those skilled in the art. It is preferred, therefore that the present invention be limited not by the specific disclosure herein, but only by the appended claims.

What is claimed is:

1. A rectifier device, which comprises:
   a n-type semiconductor substrate being a wafer;
   a top metal layer having a first side and a second side disposed above said semiconductor substrate;
   a backside layer disposed immediately below said semiconductor substrate, diffusion to said backside layer using same polarity species as said semiconductor substrate;
   one or more reduced p-n junction structures disposed between said top metal layer and said semiconductor substrate, wherein each of said reduced p-n junction structures has a thin film of first p-type doping on top of a second p-type doping and the doping concentration of said first p-type is higher than said second p-type to create an early termination at p-side such that a total charge within the depletion region of said p-n junction is reduced, wherein the interface between said top metal layer and said first p-type at p-side is an ohmic contact; and
   a plurality of edge termination structures formed proximate said first side and said second side of said top metal layer, and above said semiconductor substrate for protection purpose and sustaining high voltage.

2. The rectifier device of claim 1, said semiconductor substrate further comprising diffusion of one or more lifetime killer materials selected from the group consisting of Pt and Au to improve reverse recovery time and forward voltage drop.

3. The rectifier device of claim 1, wherein said top metal layer includes one or more elements selected from the group consisting of Pt, Au, Ni, Mo, W, Cr and Ti.

4. The rectifier device of claim 1, wherein said top metal layer further comprising a barrier metal of TiW or TiN.

5. The rectifier device of claim 1, further comprising an epitaxial layer disposed between said top metal layer and said semiconductor substrate, said epitaxial layer having same polarity but lower doping concentration than said semiconductor substrate, wherein said one or more reduced p-n junction structures is disposed in said epitaxial layer.

6. The rectifier device of claim 1, wherein said one or more reduced p-n junction structures is a doped layer.

7. The rectifier device of claim 1, wherein said one or more reduced p-n junction structures is doped regions which are formed by masking during implantation or diffusion, wherein the doping concentration of said second p-type of said reduced p-n junction is about 2 to about 10 times of n region.

8. The rectifier device of claim 5, further comprising a diode structure disposed between said one or more reduced p-n junction structures and said epitaxial layer, wherein said diode structure has lower doping concentration than said one or more reduced p-n junction structures.

9. The rectifier device of claim 1, wherein said edge termination structures are passivation layers.

10. The rectifier device of claim 5, wherein said edge termination structures are guard rings disposed in said epitaxial layer for high voltage purpose.

11. The rectifier device of claim 10, further comprising an insulation layer of oxide silicon, said insulation layer disposed above and adjacent to each of said guard rings.

12. The rectifier device of claim 6, further comprising at least one etched structure in said reduced p-n junction structures to create Schottky contact, wherein the shape of said etched structure is selected from the group consisting of round, hexagon and stripe.

13. The rectifier device of claim 12, wherein the width of said etched structure is generally larger than twice the depth of said reduced p-n junction structures.

14. The rectifier device of claim 1, further comprising at least one etched structure in said backside layer and said bottom layer to create Schottky contact.

15. The rectifier device of claim 7, further comprising at least one masked Schottky contact region spaced apart by said reduced p-n junction structures.

16. A rectifier device for reducing reverse recovery time, which comprises:
  a n-type semiconductor substrate being a wafer, wherein said semiconductor substrate including one or more lifetime killer materials selected from the group consisting of Pt and Au;
  an epitaxial layer disposed above said semiconductor substrate, said epitaxial layer having same polarity but lower doping concentration than said semiconductor substrate;
  a plurality of reduced p-n junction anodes disposed in said epitaxial layer, wherein each of said reduced p-n junction anodes having opposite polarity to said epitaxial layer and said reduced p-n junction has a thin film of first p-type doping on top of a second p-type doping and the doping concentration of said first p-type is higher than said second p-type to create an early termination at p-side such that a total charge within the depletion region of said p-n junction is reduced, and the doping concentration of said second p-type of said reduced p-n junction is about 2 to about 10 times of n region;
  a plurality of Schottky contact regions disposed in said epitaxial layer and spaced apart by said p-n junction anodes, wherein said Schottky contact regions are the masked region of photo resist and oxide layer;
  a top metal layer having a first side and a second side, disposed above said reduced p-n junction anodes, wherein said top metal layer including one or more materials selected from the group consisting of Pt, Au, Ni, Mo, W, Cr and Ti;
  a plurality of guard rings disposed in said epitaxial layer and near said first side and second side of said top metal layer for high voltage purpose, wherein said guard rings having opposite polarity to said epitaxial layer;
  an insulation layer of oxide silicon, said insulation layer disposed above and adjacent to each of said guard rings to protect said guard rings;
  a backside layer having same polarity and disposed below said semiconductor substrate, wherein the doping concentration of said backside layer is higher than said semiconductor substrate; and
  a bottom layer disposed below said backside layer and made by a metallization process or Ni plating.

\* \* \* \* \*